United States Patent
Nakaya et al.

(10) Patent No.: US 7,019,435 B2
(45) Date of Patent: Mar. 28, 2006

(54) SURFACE ACOUSTIC WAVE DEVICE

(75) Inventors: Shinobu Nakaya, Osaka (JP);
Hiroyuki Nakamura, Osaka (JP);
Shigeru Tsuzuki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 175 days.

(21) Appl. No.: 10/812,026

(22) Filed: Mar. 30, 2004

(65) Prior Publication Data

US 2004/0207491 A1    Oct. 21, 2004

(30) Foreign Application Priority Data

Mar. 31, 2003   (JP)   ............... 2003-094940

(51) Int. Cl.
*H03H 9/64*   (2006.01)
*H03H 9/145*   (2006.01)

(52) U.S. Cl. ............... 310/313 D; 310/313 R; 310/313 B; 310/313 A; 333/193; 333/195

(58) Field of Classification Search ............... 310/313; 333/193–196
See application file for complete search history.

(56) References Cited

U.S. PATENT DOCUMENTS

| | | | |
|---|---|---|---|
| 3,825,779 A | 7/1974 | deKlerk | 310/313 R |
| 4,733,122 A | 3/1988 | Shinonaga et al. | 310/313 R |
| 5,521,453 A | 5/1996 | Yatsuda | 333/193 |
| 5,592,135 A | 1/1997 | Taguchi et al. | 333/195 |
| 5,717,367 A | 2/1998 | Murai | 333/193 |
| 6,114,926 A | 9/2000 | Ueda et al. | 333/193 |
| 6,329,888 B1 | 12/2001 | Hirota | 333/193 |
| 6,597,262 B1 | 7/2003 | Takamine | 310/313 B |
| 6,717,489 B1 | 4/2004 | Takamine | 333/193 |
| 6,720,847 B1 | 4/2004 | Nako et al. | 333/193 |
| 6,744,333 B1 | 6/2004 | Sawada | 333/133 |

FOREIGN PATENT DOCUMENTS

| | | |
|---|---|---|
| JP | 10-224179 | 8/1998 |
| JP | 2002-319843 | 10/2002 |

*Primary Examiner*—Darren Schuberg
*Assistant Examiner*—J. Aguirrechea
(74) *Attorney, Agent, or Firm*—Wenderoth, Lind, & Ponack, L.L.P.

(57) ABSTRACT

In a SAW device containing two or more longitudinal mode coupling type SAW elements connected in parallel, each SAW element includes at least three comb shaped electrode pairs and a reflector electrode provided at both sides of the comb shaped electrodes. One part of respective comb shaped electrode pairs forming IDT electrodes is connected together in common by a ground connection electrode and connected with a ground pad. This configuration enables the number of connection pads to be minimized, thus providing a SAW device that is small in size and superior in filter characteristics.

37 Claims, 14 Drawing Sheets

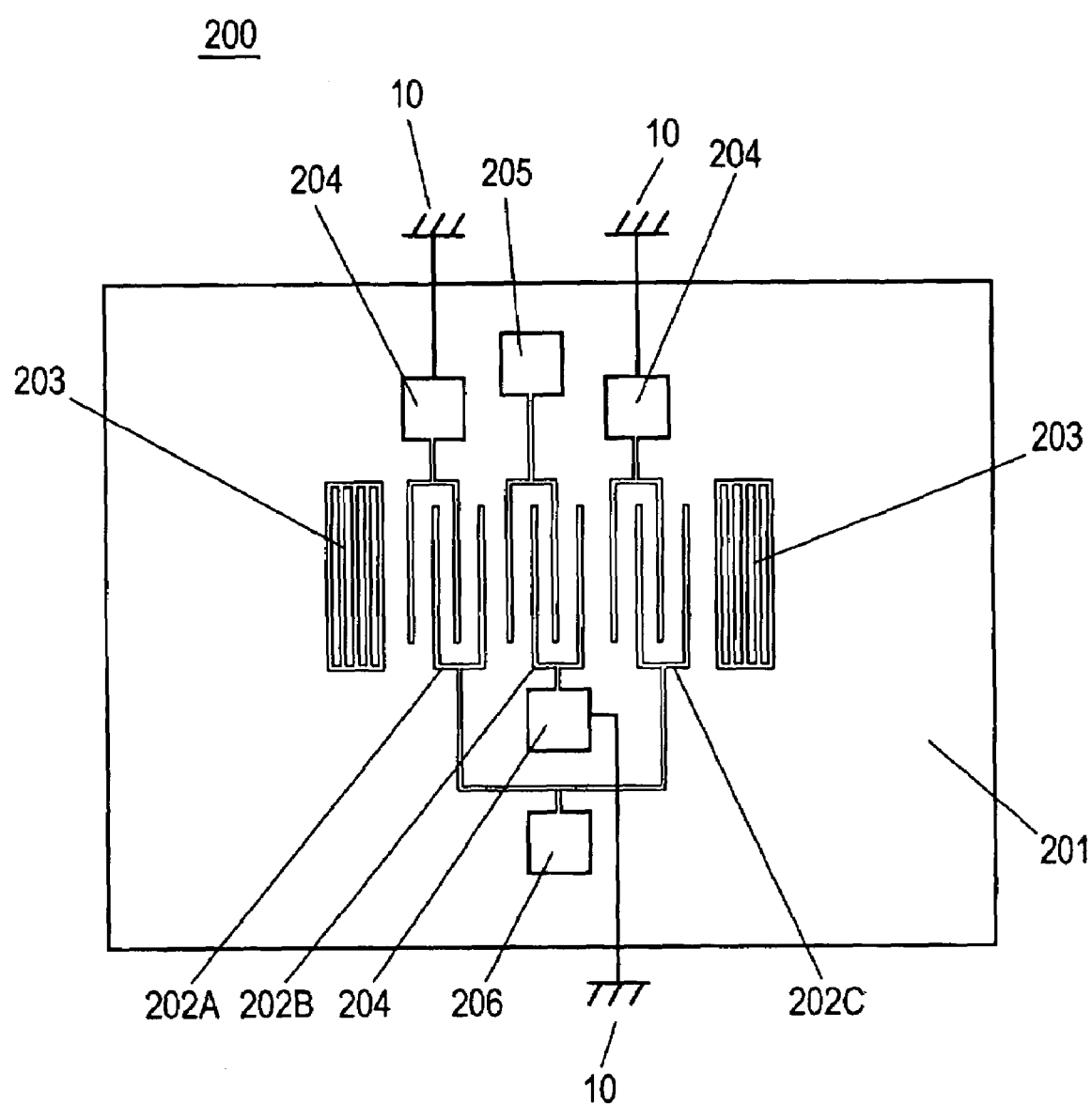

SURFACE ACOUSTIC WAVE DEVICE

FIELD OF THE INVENTION

The present invention relates to a longitudinal mode coupling type surface acoustic wave device for use in portable telephone units and similar devices.

BACKGROUND OF THE INVENTION

The performance of portable telephone units and similar devices has become very sophisticated, yet the overall size of such devices has become remarkably small. It is very important for electronic parts and components used therein to be small and thin, and to provide complex functions. In such devices, the semiconductor integrated circuits and surface acoustic wave devices (SAW devices) occupy a substantial amount of space therein, among other electronic parts and components. Therefore, downsizing these items is a matter of great importance.

In the SAW device sector, downsizing has been pursued mostly through optimization in the pattern layout of electrodes. However, there is a limitation in this approach.

FIG. 14 shows a typical electrode pattern of a conventional SAW device 200. SAW device 200 includes interdigital transducer electrodes (IDT electrodes) 202A, 202B, 202C, a reflector electrode 203 provided at both sides of the IDT electrodes, a ground pad 204 connected to a grounding electrode terminal 10, an input pad 205 and an output pad 206 provided on a piezoelectric substrate 201. Each of IDT electrodes 202A, 202B and 202C is formed of a comb shaped electrode pair in which a plurality of finger electrodes are coupled to each other. A first part of the each comb shaped electrode pair forming IDT electrodes 202A and 202C located at both ends is connected with separate ground pads 204, while a second part is connected together with common output pad 206. A first part of the comb shaped electrode pair forming the central IDT electrode 202B is connected with input pad 205, while a second part is connected with ground pad 204.

Ground pad 204 is connected with grounding terminal 10 formed on a stem (not shown) by means of a wire lead or other suitable connecting structure.

As shown in FIG. 14, there are three ground pads 204, one input pad 205 and one output pad 206 on the SAW device; totaling five pads, each occupying a certain specific area. An area occupied by a pad is substantially large in relation to that occupied by IDT electrodes 202A, 202B, 202C and reflector electrode 203. The area required for five pads represents the largest factor against device downsizing. In addition, since respective ground pads 204 are grounded (with grounding electrode terminals) separately, the ground level is not low enough, and is not stable, thereby leading to deteriorated filter characteristics.

In a SAW device, IDT electrodes have been reduced in size by shrinking the electrode pattern and optimizing the layout. On the other hand, the reduction of pad area remains very difficult because ground pads, input pads and output pads for connection with external terminals require a certain minimum area if a certain connecting strength with a wire lead and reliability in electrical connection are to be guaranteed. This means that further reduction in the pad area is not an easy task. Instead, a reduction in the number of pads is more effective for downsizing a SAW device.

Other methods have been proposed to reduce the device size of a SAW device such as eliminating a stage-to-stage coupling capacitance section which used to be added for improving the cutoff characteristics of a passing band and increasing attenuation level, or an inductance section. For example, Japanese Patent Laid-Open Application No. H10-224179 discloses a method of eliminating the stage-to-stage inductance, in a device formed of primary-tertiary serial coupling double mode surface acoustic wave filters consisting of three IDT electrodes and two reflectors disposed at both sides of the IDT electrodes on a piezoelectric substrate, wherein the filters are serially connected in multi-stages. Namely, the stage-to-stage inductance is made to be approximately zero in terms of capacitance by making the electrode pair counts to be different between the IDT electrodes located at both sides, among the three IDT electrodes; and the end-to-end spaces from the central IDT electrode to the IDT electrodes on either side was established to be approximately $5\lambda/4$ for one of the spaces, and the other space to be different from that of the first.

However, even if the stage-to-stage coupling capacitance section or inductance section is eliminated, like in the above example, there is a limitation in the downsizing. Furthermore, since connection to grounding terminals from respective pads is made separately, the ground level is not sufficiently low, and not stable. Thus, the problem of deterioration in the filter characteristics remains unsolved, like in the first example discussed above.

SUMMARY OF THE INVENTION

The present invention aims to implement the downsizing of a SAW device through reduction of the number of pads.

A SAW device according to the present invention includes a longitudinal mode coupling type surface acoustic wave element having at least three interdigital transducer electrodes, wherein each of the interdigital transducer electrodes is formed of a comb shaped electrode pair. Reflector electrodes are disposed at both sides of the interdigital transducer electrodes. The surface acoustic wave element is disposed on a substrate having a piezoelectric property and is disposed in the propagating direction of a surface acoustic wave generated by the interdigital transducer electrodes such that two or more surface acoustic wave elements can be connected in a parallel arrangement.

One part of each comb shaped electrode pair forming the interdigital transducer electrodes is connected together with a common ground pad, while the other part of each comb shaped electrode pair is connected with an input pad or and output pad, and provided in an area opposite to the ground pad.

In the above configuration, the number of pads can be reduced, and thus, the total space needed for providing the pads in a SAW device becomes smaller. As a result, a SAW device that is smaller than the conventional SAW device can be provided. Furthermore, since the ground pads can be connected to a common grounding, the ground level can be lowered and stabilized, which contributes to the implementation of a SAW device having superior filter characteristics.

BRIEF DESCRIPTION OF THE DRAWINGS

Aspects of illustrative, non-limiting embodiments of the present invention will become more apparent by describing in detail embodiments thereof with reference to the attached drawings, which are described briefly below.

FIG. 14 shows a structure of a conventional SAW device.

DETAILED DESCRIPTION OF THE INVENTION

Figure 1:
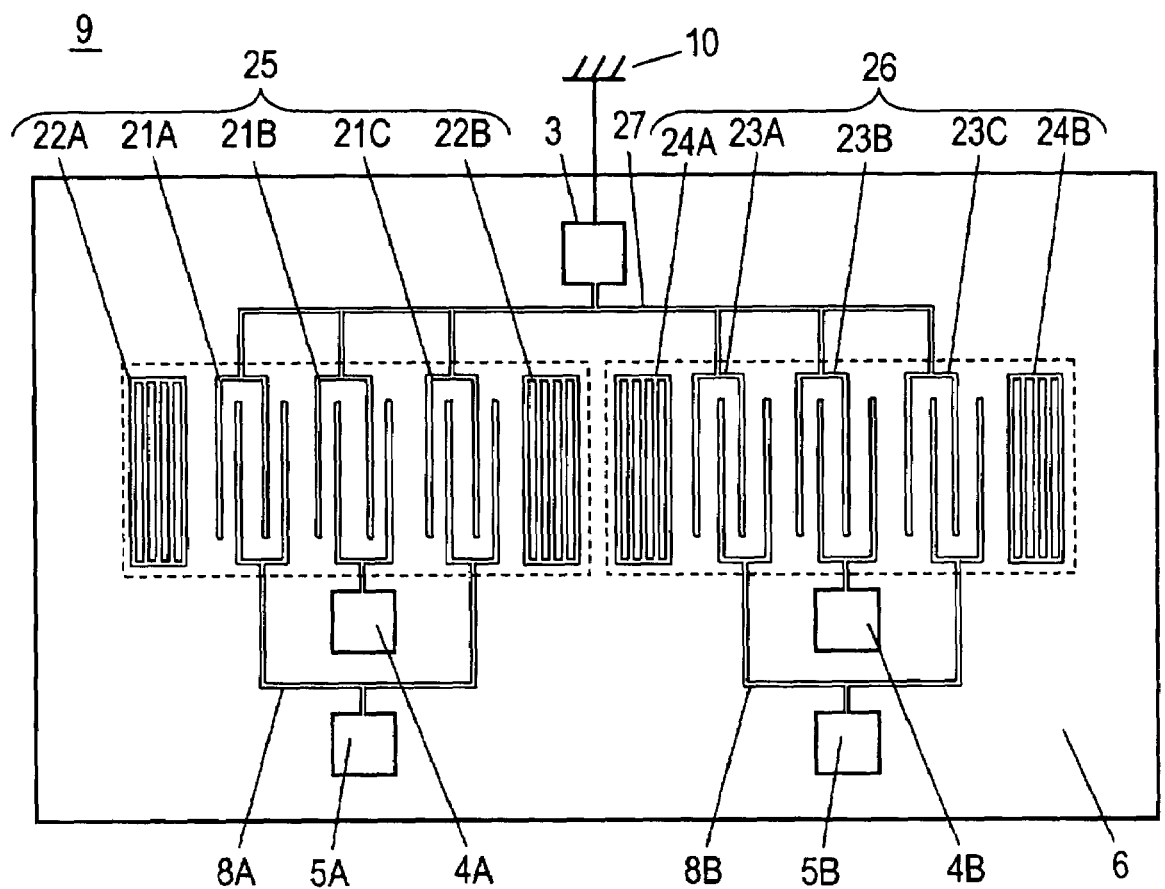
FIG. 1 is a plan view showing a structure of electrodes in a SAW device in accordance with a first exemplary embodiment of the present invention.

Exemplary embodiments of the present invention are described below referring to the drawings. Elements identical to each other are represented by using identical reference marks. The drawings have been prepared just to provide the structural concept of the electrodes. For example, although only two finger electrodes are shown for the comb shaped electrode pair forming an IDT electrode, the number of finger electrodes in the actual SAW device is greater. Although the width of finger electrodes and their gaps are substantially equal in most real devices, the finger electrodes in the drawings are shown finer in relation to the gaps, for easier comprehension. The bus bar electrode for connecting one part of a plurality of finger electrodes together in common, as well as the connection electrode for leading the bus bar electrode to a pad, are also illustrated in the drawings with finer lines. Actual finger electrodes, connection electrodes, etc., may be designed at their optimized widths.

First Exemplary Embodiment

FIG. 1 is a plan view which shows an electrode structure of a SAW device 9 in accordance with a first exemplary embodiment of the present invention. SAW device 9 in the present embodiment includes two surface acoustic wave elements (SAW elements) 25 and 26 provided on a piezoelectric substrate 6, and connection electrodes for connecting these elements together and various other pads. Left SAW element 25 is formed of three IDT electrodes 21A, 21B, 21C, and reflector electrodes 22A, 22B disposed at both sides of IDT electrodes 21A, 21B, 21C in the propagating direction of a surface acoustic wave (SAW) generated by IDT electrodes 21A, 21B, 21C. Likewise, right SAW element 26 is formed of three IDT electrodes 23A, 23B, 23C, and reflector electrodes 24A, 24B disposed at both sides of IDT electrodes 23A, 23B, 23C in the propagating direction of the SAW generated by the IDT electrodes. As shown in FIG. 1, left SAW element 25 and right SAW element 26 are connected together in parallel arrangement.

Each of the IDT electrodes is formed of a comb shaped electrode pair. One part of each comb shaped electrode pair forming respective IDT electrodes 21A, 21B, 21C in left SAW element 25 and IDT electrodes 23A, 23B, 23C in right SAW element 26 is connected together in common by a ground connection electrode 27 to be connected with a ground pad 3. Ground pad 3 is connected with grounding electrode terminal 10, which is provided for connection with an external circuit (not shown). Grounding electrode terminal 10 is disposed on a stem (not shown) which has been provided for holding piezoelectric substrate 6, or on a mounting substrate (not shown). Ground pad 3 and grounding electrode terminal 10 are connected via, e.g., a wire lead.

The other part of each comb shaped electrode pair forming respective IDT electrodes 21A and 21C located at both sides of left SAW element 25 is connected together by output connection electrode 8A to be connected with output pad 5A. The other part of the comb shaped electrode pair forming central IDT electrode 21B is connected with input pad 4A.

Likewise, the other part of each comb shaped electrode pair forming respective IDT electrodes 23A and 23C located at both sides of right SAW element 26 is connected together by output connection electrode 8B to be connected with output pad 5B. The other part of the comb shaped electrode pair forming central IDT electrode 23B is connected with input pad 4B.

As described above, SAW device 9 in the present embodiment has one ground pad 3, two input pads 4A and 4B, two output pads 5A and 5B, totaling five pads, on piezoelectric substrate 6. The electrodes are structured so that input pads 4A and 4B and output pads 5A and 5B operate in a balance. In order to implement the balanced operation, the shape of IDT electrodes 21A, 21B, 21C, 23A, 23B, 23C can be different so that the capacitance and other factors become equal. The adjusting can be performed by a known process, so the description of the adjusting method is not described here. The balanced operation makes it easier to establish a matched impedance with semiconductor ICs and other components. Thus, the loss at SAW device 9 can be reduced.

The electrode structure of SAW device 9 in the present embodiment has been designed so that the impedance of each of left SAW element 25 and right SAW element 26 is 100Ω. Therefore, impedance as viewed from input pad 4A, 4B, or output pad 5A, 5B, is 50Ω, since there are two SAW elements, left SAW element 25 and right SAW element 26, each having 100Ω impedance, connected in parallel.

Namely, in a case where there are n pieces of SAW elements (n: an integer 2 or any number higher than 2) connected in parallel, impedance of a SAW device as a whole can be made to be 50Ω by designing the electrodes so that impedance of each SAW element is (50×n)Ω, and connecting n pieces of the SAW elements in parallel. Thus, impedance as viewed from input pads 4A, 4B, or output pads 5A, 5B, turns out to be 50Ω. Thus, the connecting compatibility with external components and devices can be increased. For making the impedance at each of the parallel-connected SAW elements to be (50×n)Ω, the overlap length of respective finger electrodes of the comb shaped electrodes forming the IDT electrode may be optimized. A narrowed overlap length brings about a reduced capacitance of the IDT electrode, and thus, the impedance can be made to be greater. If, for example, the overlap length of finger electrodes is made to be 1/n, then the impedance of the SAW element can be made to be n times as great. Furthermore, a reduced overlap length at each of the finger electrodes leads to a reduced electric resistance of the IDT electrode. This causes a reduced loss and an increased amount of attenuation.

The above-described method of controlling the impedance of the SAW element through a shift of capacitance, which is caused by changing the overlap length at respective finger electrodes, is applicable to all of the other embodiments described herein.

Next, a method of manufacturing SAW device 9 in the present embodiment is described.

First, a thin film of aluminum (Al) or other metal is provided on a piezoelectric substrate made of lithium tantalate (LiTaO$_3$), etc., by sputtering or another process. Next, a photo resist is applied on the thin metal film and exposed with a desired pattern using an exposure facility to develop it. Unnecessary parts of the thin metal film are etched away, and the photo resist is removed. Ground pad 3, input pads 4A, 4B, and output pads 5A, 5B may be provided with a reinforcement electrode for making wire bonding easier, or a bump may be formed for flip chip bonding. The reinforcement pad or bump may be utilized depending on a mounting method to be used. In some cases, an insulating protection layer is provided on the surface of the IDT electrode. After undergoing these processes, the substrate wafer having a plurality of SAW devices 9 formed thereon is cut into individual pieces. A finished SAW chip is thus provided.

SAW device 9 may be mounted as it is in the chip state as shown in FIG. 1 on a circuit board, etc. However, it is a general practice to place it in a package, such as semiconductor ICs. For example, when a package consisting of a stem and a lid is used, one of the individually cut pieces of piezoelectric substrate 6 is fixed by adhesive on the stem, and then the ground pad, input pad and output pad are connected to electrode terminals, including grounding electrode terminal, which have been provided on the stem, via wire lead, bump, etc.; and then the stem is sealed tight with the lid.

Since the number of pads can be reduced in SAW device 9 of the present embodiment, the device size can be made smaller. Furthermore, since the impedance matching can be made easily, it can be connected with ICs, etc., with good conformity. Still further, since one part of the comb shaped electrode pair forming respective IDT electrodes 21A, 21B, 21C, 23A, 23B, 23C is connected together in common by grounding connection electrode 27 to be connected with ground pad 3, the grounding is made in common and the ground level is sufficiently low. As a result, the attenuation level can be made greater and the filter characteristic within a certain frequency band can be improved.

In SAW device 9 in the present embodiment, the layout positioning between input pads 4A, 4B and output pads 5A, 5B may be reversed and produce the same effects.

Although SAW device 9 in the present embodiment has been described based on a balanced type where the operation is balanced, it is also possible that at least one of the input pad and the output pad is an unbalanced type.

The description of SAW device 9 in the present embodiment has been based on an example as shown in FIG. 1, where two SAW elements 25 and 26, each having three parallel-connected IDT electrodes, are connected in parallel. However, it is not the intention of the present invention to be limited to the above configuration. The number of IDT electrodes forming a SAW element can be 3 or any number more than 3, and the number of SAW elements connected in parallel can be 2 or any number more than 2.

Figure 2:
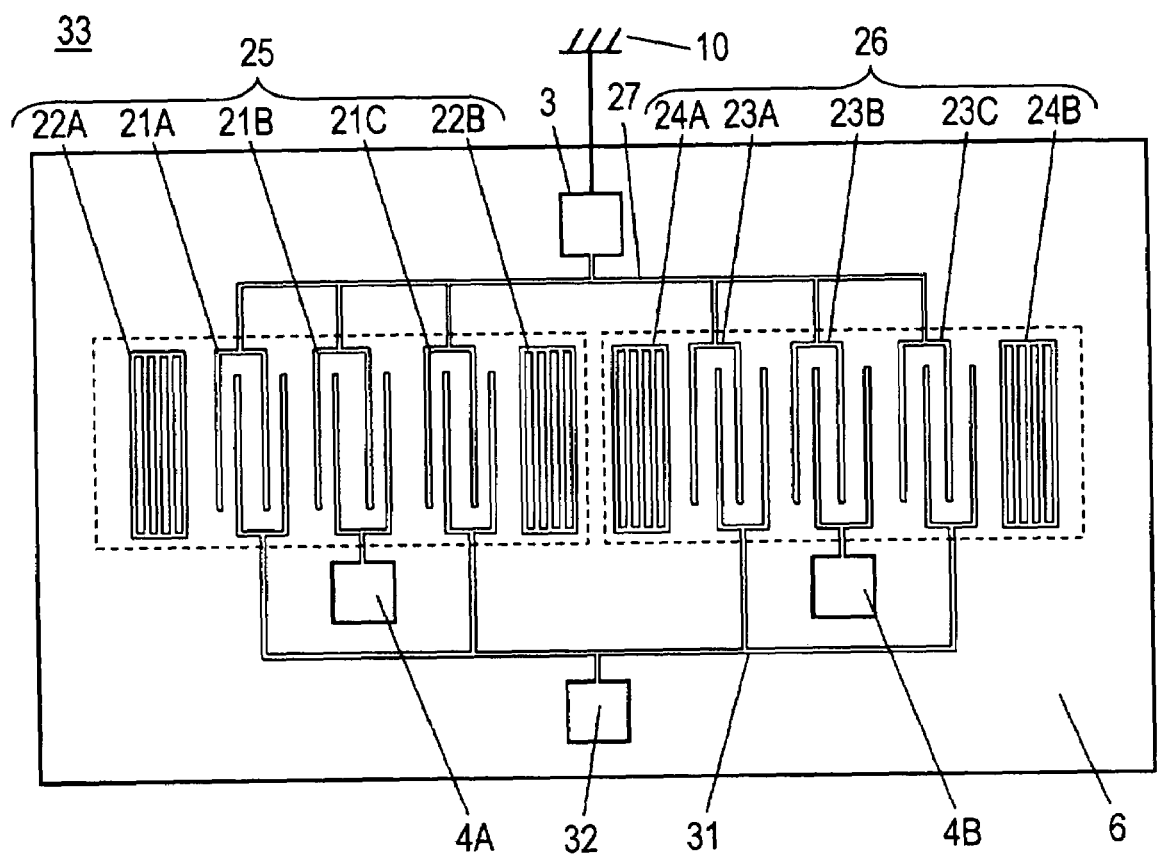
FIG. 2 shows a modification of the electrode structure in the first embodiment.

FIG. 2 shows a modification of the electrode structure shown in FIG. 1. In modified SAW device 33, the other part of each comb shaped electrode pair forming IDT electrodes 21A and 21C in left SAW element 25 and IDT electrodes 23A and 23C in right SAW element 26 is connected together by output connection electrode 31 to be connected with one output pad 32. This is the point of difference as compared with SAW device 9.

In the above structure, the number of pads can be reduced to four; therefore, the size of SAW device 33 can be reduced a step further.

Although the present embodiment has been described with reference to FIG. 1 and FIG. 2, it is not the intention of the present invention to be limited to those structures referred to above. For example, the pads are of a square shape in the present embodiment, but they may be a rectangular shape as well. In addition, while output pad 32 in FIG. 2 is disposed on the side opposite to input pads 4A and 4B with respect to output connection electrode 31, the output pad 32 may be disposed on the same side as the input pads. Furthermore, while the IDT electrodes in the present embodiment are formed with a pair of comb shaped electrodes, the comb shaped electrode may be provided with a floating strip line electrode disposed between the finger electrodes, or it may take a structure of weighted IDT electrodes.

Second Exemplary Embodiment

Figure 3:
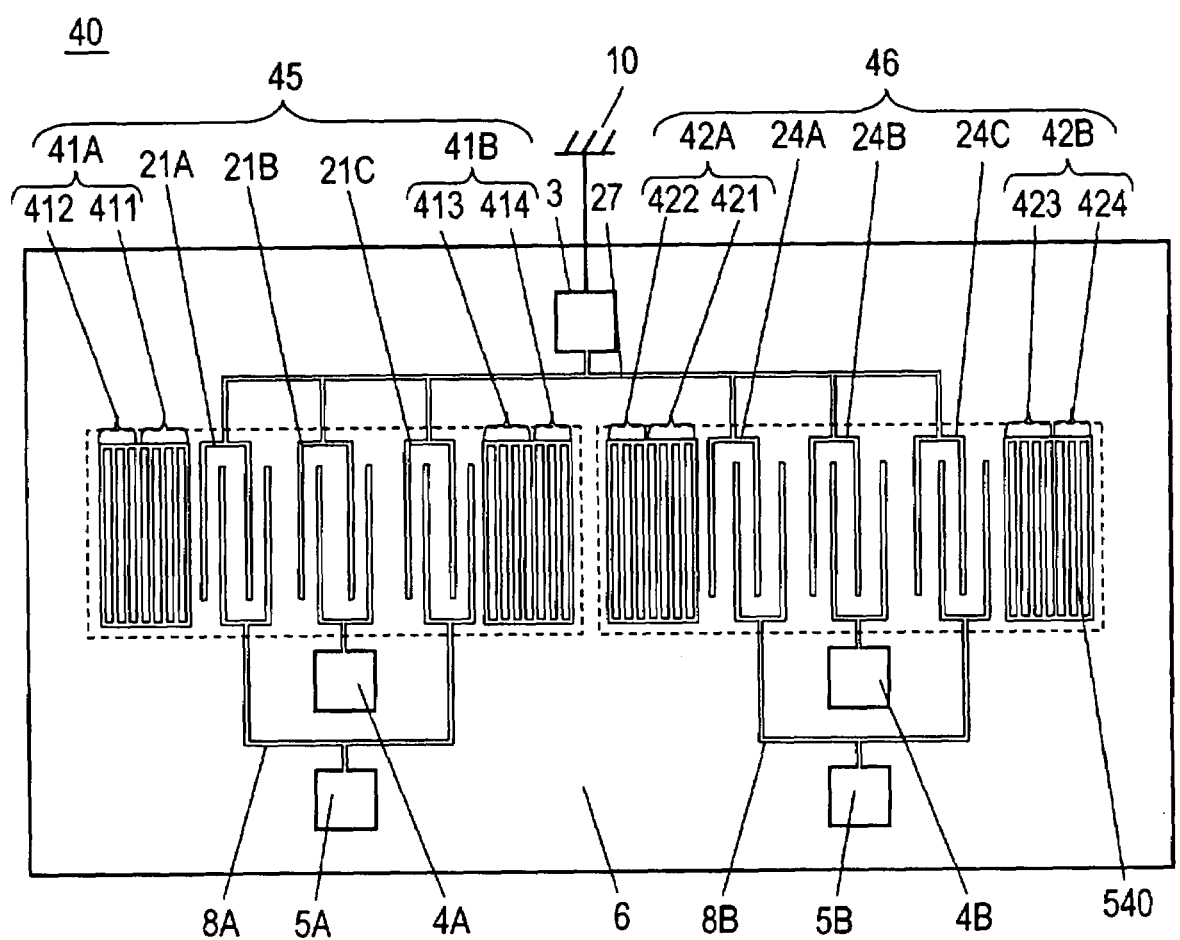
FIG. 3 is a plan view showing a structure of electrodes in a SAW device in accordance with a second exemplary embodiment of the present invention.

SAW device 40 in accordance with a second exemplary embodiment of the present invention is described with reference to FIG. 3. FIG. 3 is a plan view showing an electrode structure in SAW device 40. The point of difference from SAW device 9 of the first embodiment is that in SAW device 40 in the present embodiment the gap between strip line electrodes 540 is partially different in each of reflector electrodes 41A, 41B of left SAW element 45 and reflector electrodes 42A, 42B of right SAW element 46.

Namely, reflector electrodes 22A, 22B, 24A, 24B in SAW device 9 have equal electrode gaps between strip line electrodes. In SAW device 40 in the present embodiment, the electrode gap of strip line electrodes 540 is made to be narrower in the respective end-regions.

That is, the electrode gap of strip line electrodes 540 in reflector electrode 41A is narrower in region 412 than that in region 411. The electrode gap of strip line electrodes 540 in reflector electrode 41B is narrower in region 414 than that in region 413. Also, in reflector electrodes 42A and 42B, the electrode gap of strip line electrode 540 is narrower in region 422 than that in region 421, and the electrode gap of strip line electrodes 540 is narrower in region 424 than that in region 423.

By partially changing the electrode gap of strip line electrodes 540 in reflector electrodes 41A, 41B, 42A and 42B, the reflection property can be changed and a place where a spurious response is generated can be changed. Thus, by designing SAW device 40 so that spurious responses offset each other, the spurious effects can be made to be very small and attenuation level can be increased.

As in the first embodiment, the relative location between input pad 4A, 4B and output pad 5A, 5B may be exchanged and yield the same effects. In addition, output connection electrodes 8A and 8B may be connected together to be connected with one output pad, in the same manner as in SAW device 33 shown in FIG. 2, to the same effects.

Although the electrode gap between strip line electrodes 540 of reflector electrodes 41A, 41B, 42A, 42B in SAW device 40 in the present embodiment has been described to be different in some of the regions, the gap may change continuously over the entire region, or change in steps. Thus, the spurious effects can be made small and the attenuation level increased.

The clearance between reflector electrode 41B of left SAW element 45 and reflector electrode 42A of right SAW element 46 may be determined to be different from electrode gaps between strip line electrodes 540 in respective reflector electrodes 41B and 42A. Thus, the reflection property can be changed in a manner so that spurious responses offset each other, and spurious effects can be made small. As a result, the attenuation level can be increased.

The above-described structure is applicable also to other embodiments including the first embodiment.

Figure 4:
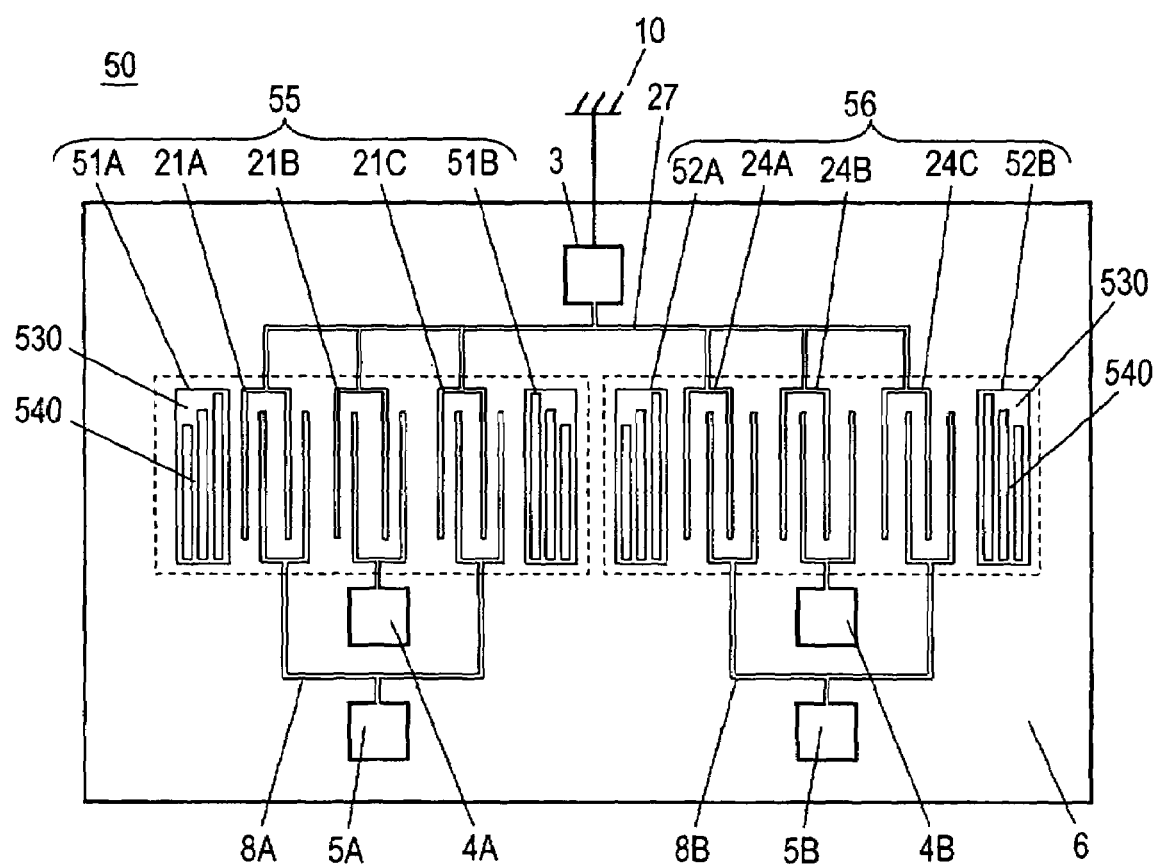
FIG. 4 shows a modification of the electrode structure in the second embodiment.

FIG. 4 is a plan view used to describe an electrode structure in SAW device 50, which is a modification of the second exemplary embodiment. The electrode gap between strip line electrodes 540 in SAW device 50 remains equal in respective reflector electrodes 51A, 51B, 52A, 52B forming SAW elements 55 and 56. However, by changing the shape of bus bar electrode 530, which in effect changes the length of strip line electrodes 540, the place where a spurious response is generated can be changed. Thus, the spurious generation can be suppressed and the attenuation level increased by the above-described method, similar to the method in which the electrode gap between strip line electrodes 540 of reflector electrodes 51A, 51B, 52A, 52B is changed.

Although SAW device 40 in the present embodiment has been described such that it includes two SAW elements 45 and 46 connected in parallel, and that modified SAW device 50 includes two SAW elements 55 and 56 connected in parallel, it is not the intention of the present embodiment to be limited to these configurations. For example, since an increase in number of the parallel-connected SAW elements is effective to reduce the loss, the number of parallel-connected SAW elements may be two or any number higher than two.

Namely, in SAW device 40, or modified SAW device 50, in the present embodiment, the electrode gap between strip line electrodes 540 of the reflector electrodes is made to be partially different, or the shape of the bus bar electrode is changed from place to place to accommodate different lengths of strip line electrodes 540. With these structures, generation of SAW spurious responses can be suppressed and attenuation level is greater. Although each of the structures, viz., the different electrode gap size and the different electrode lengths, has been introduced in separate SAW devices in the present embodiment, a SAW device may include a combination of these structures.

Third Exemplary Embodiment

Figure 5:
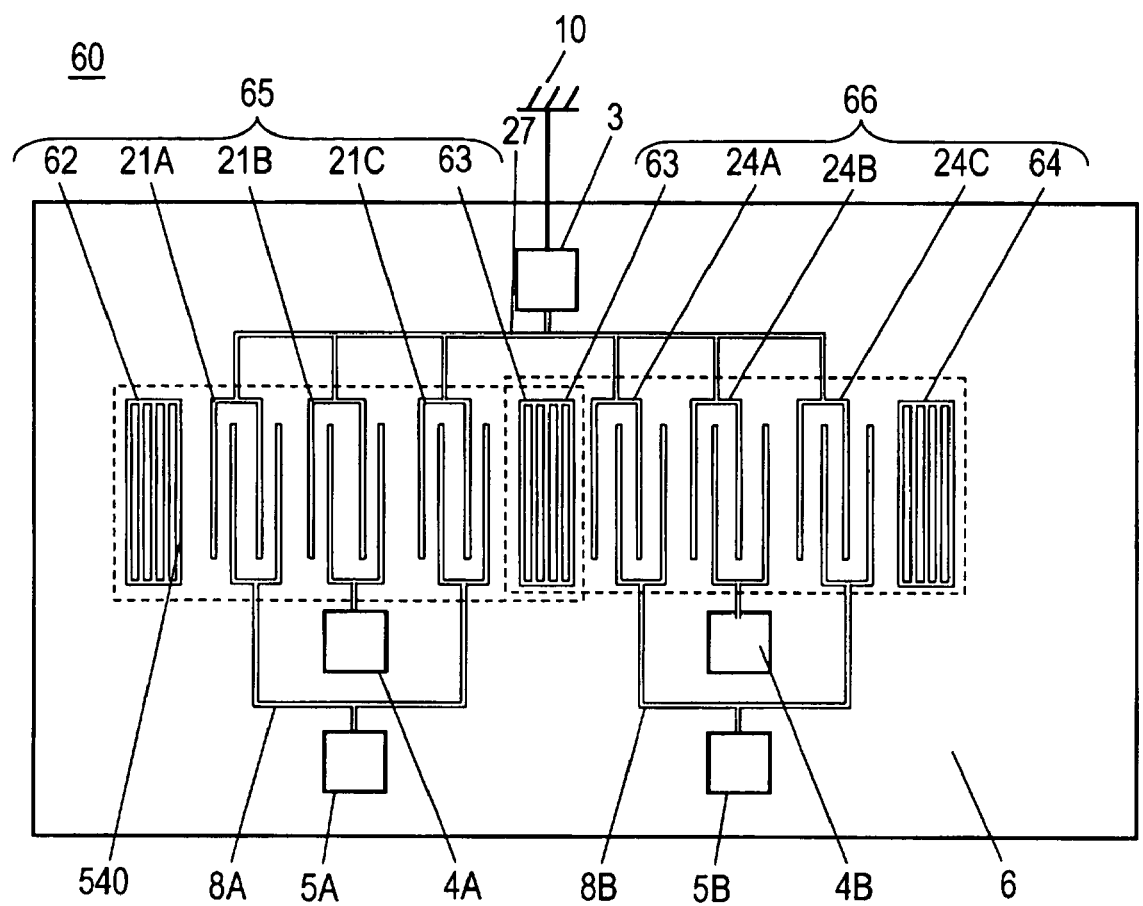
FIG. 5 is a plan view showing a structure of electrodes in a SAW device in accordance with a third exemplary embodiment of the present invention.

A SAW device in accordance with a third exemplary embodiment of the present invention is described with reference to FIG. 5. FIG. 5 is a plan view showing an electrode structure of the SAW device. The point of difference from the first embodiment is that left SAW element 65 and right SAW element 66 in SAW device 60 of the present embodiment are connected in parallel, wherein among reflector electrodes 62, 63 and 64 forming SAW elements 65 and 66, the central reflector electrode 63 is used in common.

Namely, in SAW device 9 of the first embodiment, each of left SAW element 25 and right SAW element 26 is provided at both sides with reflector electrodes 22A, 22B, and reflector electrodes 24A, 24B, respectively. Whereas, in SAW device 60 in the present embodiment, the central reflector electrode 63 is shared in common by left SAW element 65 and right SAW element 66. The rest of the structures remain the same as those of SAW device 9 in the first embodiment.

As shown in FIG. 5, SAW elements 65 and 66 use the central reflector electrode 63 in common. Thus, it uses one less reflector electrode than SAW device 9 of the first embodiment. This enables further downsizing of SAW device 60 in the present embodiment. Furthermore, it is easier to put input pads 4A, 4B and output pads 5A, 5B into a balanced operation. Still further, since one part of each comb shaped electrode pair forming IDT electrodes 21A, 21B, 21C, 24A, 24B, 24C is connected together by ground connection electrode 27 to be led to ground pad 3, the grounding can be common and the ground level is sufficiently low and stable. Therefore, attenuation level can be increased, and other filter characteristics can be improved.

Also in the present embodiment, the relative layout positioning between input pads 4A, 4B and output pads 5A, 5B may be reversed for the same effects.

Although SAW device 60 in the present embodiment has been described based on a balanced type, at least either one of the input pads 4A, 4B and the output pads 5A, 5B can be an unbalanced type.

The description of SAW device 60 in the present embodiment has been based on an example in which two SAW elements 65 and 66 are connected in parallel. However, it is not the intention of the present invention to be limited to this configuration. For example, the number of parallel-connected SAW elements can be 2 or any number higher than 2, wherein the greater the number of parallel-connected SAW elements, the lower the loss.

Furthermore, the electrode structure of SAW device 60 in the present embodiment has been designed so that each of left SAW element 65 and right SAW element 66 has an impedance of 100Ω. Since two 100Ω SAW elements 65 and 66 are connected in parallel, impedance as viewed from input pads 4A, 4B or output pads 5A, 5B is 50Ω.

Namely, in a case where there are n pieces of SAW elements (n: an integer 2 or any number higher than 2) connected in parallel, if the electrodes are designed such that each of the SAW elements has an impedance of (50×n )Ω, then the overall impedance of a SAW device having n pieces of SAW elements connected in parallel can be made to be 50Ω. Thus, since the impedance as viewed from input pads 4A, 4B or output pads 5A, 5B is 50Ω, matching of impedance with a circuit, on which ICs and SAW device 9 are mounted, becomes easy. This leads to an improved connection compatibility and lower loss.

In SAW device 60 in the present embodiment, the electrode gap between strip line electrodes 540 of reflector electrodes 62, 63 and 64 is substantially equal. However, it is not the intention of the present invention to be limited to this configuration. For example, like the example of second embodiment, the entire electrode gap may be continuously different, or it may be different only in a certain specific region. Further, the lengths of strip line electrodes 540 of reflector electrodes 62, 63 and 64 may be made to be different in effect by changing the shape of bus bar electrode, as described with respect to the modification in the second embodiment.

Figure 6:
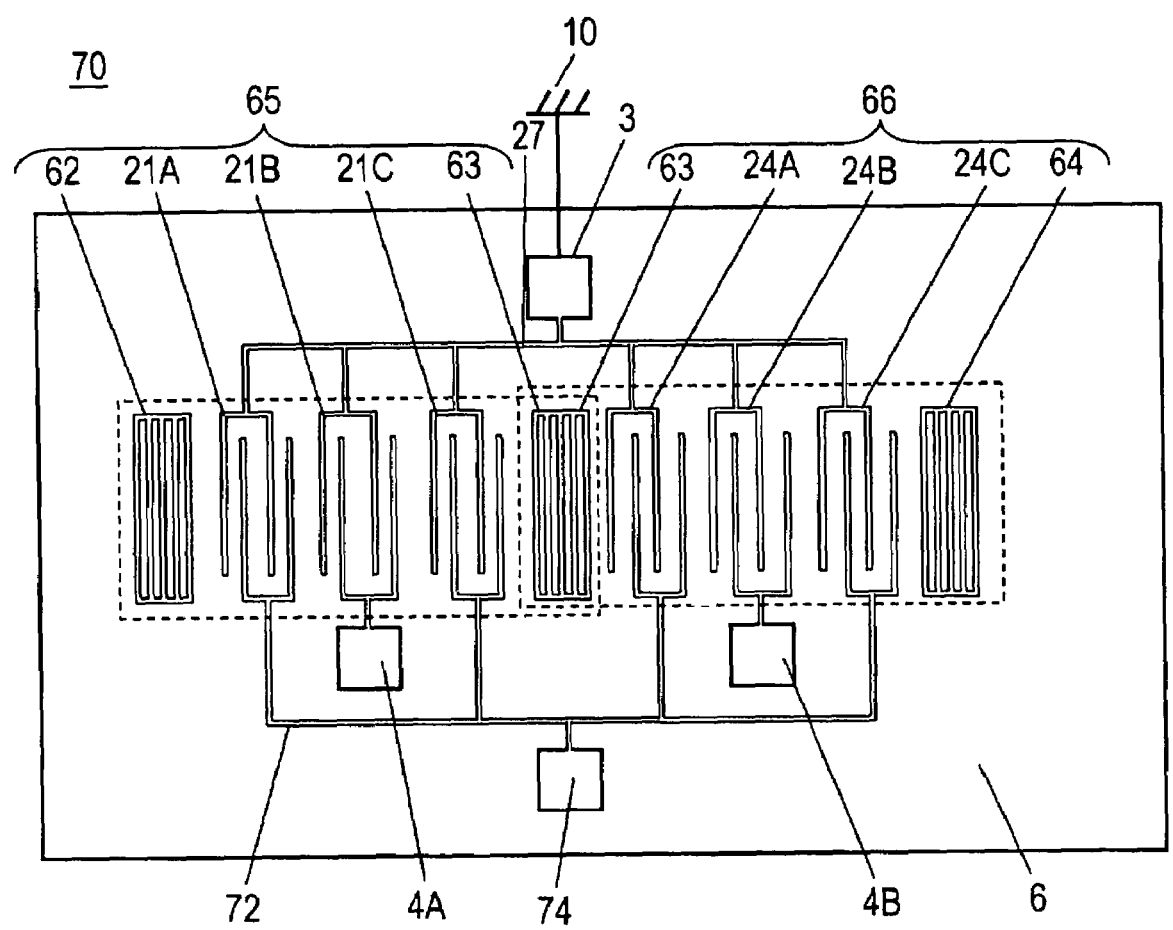
FIG. 6 shows a modification of the electrode structure in the third embodiment.

FIG. 6 is a plan view used to show an electrode structure of SAW device 70, which is a modification of the present embodiment. As shown in FIG. 6, the other part of each comb shaped electrode pair forming IDT electrodes 21A, 21C, 24A, 24C of SAW elements 65, 66 is connected together by output connection electrode 72 to be led to output pad 74. In this structure, since the outputs are equal and stable, the attenuation level in SAW device 70, among other filter characteristics, can be increased.

Furthermore, as compared with SAW device 9 in the first embodiment, the number of reflector electrodes can be reduced by one because SAW elements 65 and 66 share the central reflector electrode 63 in common. This gives way to further reduction in the size of a SAW device.

Fourth Exemplary Embodiment

Figure 7:
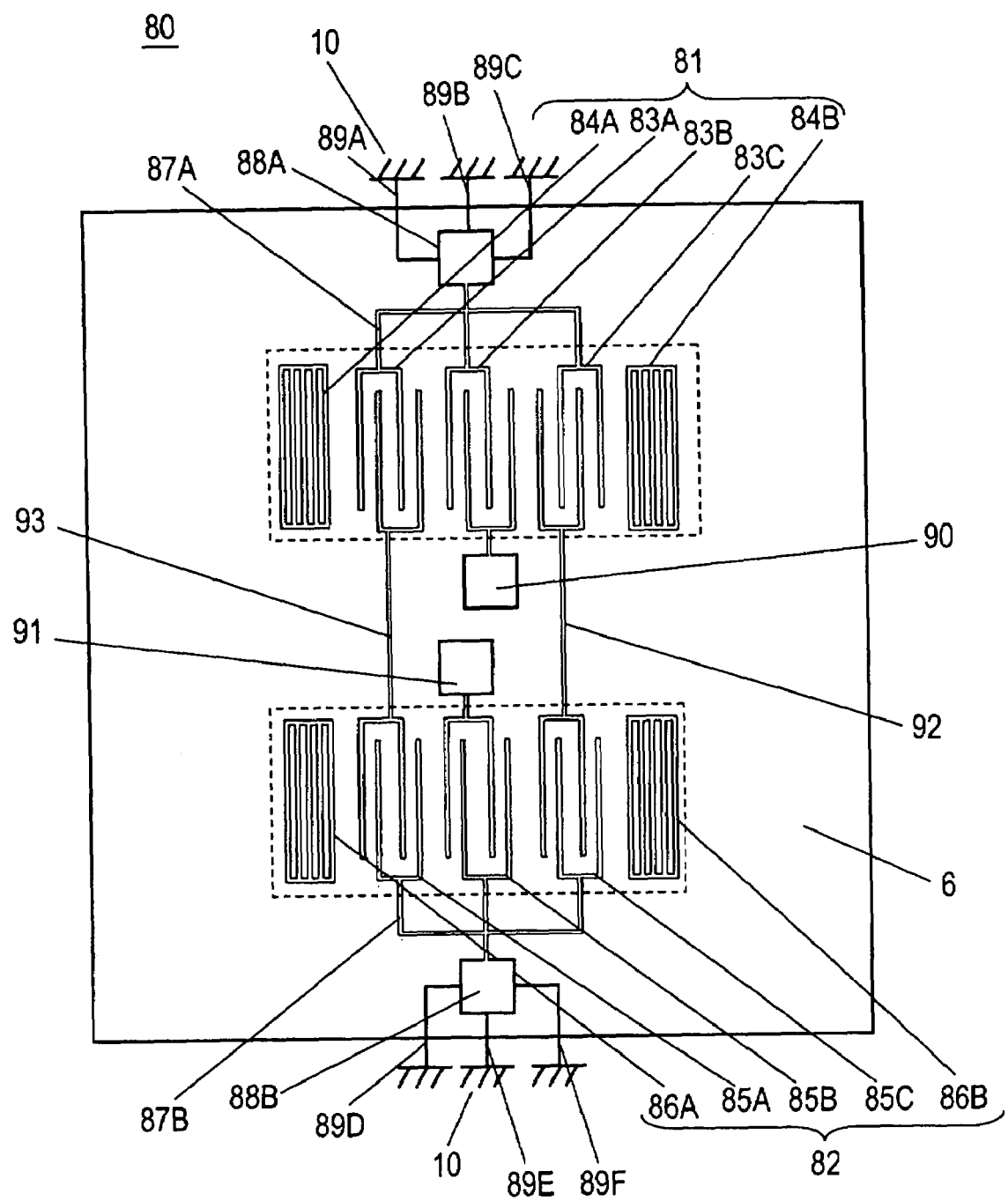
FIG. 7 is a plan view showing a structure of electrodes in a SAW device in accordance with a fourth exemplary embodiment of the present invention.

SAW device 80 in accordance with a fourth exemplary embodiment of the present invention is described with reference to FIG. 7. FIG. 7 is a plan view showing an electrode structure of SAW device 80 in the present embodiment.

SAW device 80 in the present embodiment has longitudinal mode coupling type SAW elements 81 and 82 disposed in the direction that is perpendicular to the SAW propagating direction. In other words, it has a structure of a two-stage serial connection. Hereafter, SAW element 81 will be referred to as the first stage, while SAW element 82 will be referred to as the second stage.

First stage SAW element 81 includes IDT electrodes 83A, 83B, 83C and reflector electrodes 84A and 84B disposed at both sides of the IDT electrodes. Second stage SAW element 82 includes IDT electrodes 85A, 85B, 85C and reflector electrodes 86A and 86B disposed at both sides of the IDT electrodes.

As shown in FIG. 7, one part of each comb shaped electrode pair of IDT electrodes 83A, 83B, 83C in first stage SAW element 81 is connected together in common by ground connection electrode 87A to be led to ground pad 88A. The other part of the comb shaped electrode pair of IDT electrodes 83A and 83C located at both sides of SAW element 81 is connected via element-to-element connection electrodes 92, 93 with the other part of the comb shaped electrode pair of IDT electrodes 85A and 85C located at both sides of second stage SAW element 82. The other part of the comb shaped electrode pair of the central IDT electrode 83B in first stage SAW element 81 is connected with input pad 90.

One part of each comb shaped electrode pair of IDT electrodes 85A, 85B, 85C in second stage SAW element 82 is connected together by ground connection electrode 87B to be led to ground pad 88B. The other part of the comb shaped electrode pair of IDT electrodes 85A and 85C located at both sides of SAW element 82 is connected, as described earlier, via element-to-element connection electrodes 92, 93 with the other part of the comb shaped electrode pair of IDT electrodes 83A and 83C located at both sides of first stage SAW element 81. The other part of the comb shaped electrode pair of the central IDT electrode 85B in second stage SAW element 82 is connected to output pad 91.

As described above, two ground pads 88A and 88B of SAW device 80 in the present embodiment are disposed symmetric to each other, and input pad 90 and output pad 91 are disposed in between SAW element 81 and SAW element 82. Respective ground pads 88A and 88B are connected with grounding electrode terminals 10 via three wire leads 89A, 89B, 89C and 89D, 89E, 89F, made of, e.g., aluminum (Al).

Grounding electrode terminal 10 is provided on a stem (not shown) holding piezoelectric substrate 6.

With the exception of the layout structure as described above, SAW device 80 has the same design as SAW device 9 of the first embodiment, and manufactured using the same process.

Since SAW device 80 in the present embodiment has the longitudinal mode coupling type SAW elements 81 and 82 connected in a two-stage serial connection, the attenuation level, among other filter characteristics, can be increased. Furthermore, since SAW device 80 includes only four pads, viz., two ground pads 88A and 88B, one input pad 90 and one output pad 91, SAW device 80 can be small in size and have superior filter characteristics.

Furthermore, if the element-to-element connection electrodes 92 and 93 connecting comb shaped electrodes of outer IDT electrodes 83A, 83C, 85A, 85C in SAW elements 81 and 82 are made to be reverse-phased to each other, the cross talk between IDT electrodes 83A, 83C, 85A, 85C and element-to-element connection electrodes 92, 93 can be reduced. Thereby, attenuation level can be further increased.

Furthermore, the symmetrical disposition of input pad 90, output pad 91 and ground pads 88A, 88B and other considerations in the electrode structure designing make it easy to implement a balanced operation. In this configuration, since impedance as viewed from input pad 90, or output pad 91, can be made to be 50Ω, matching of impedance with a circuit, on which ICs and like devices, and the SAW device are to be mounted, becomes easy. This leads to an improved connection compatibility and to lower loss .

Still further, connection resistance between ground pad 88A, 88B and grounding electrode terminal 10 can be lowered by the use of a plurality of wire leads, or bumps. Thus, the ground level can be lowered a step further and made more stable. Thus, the attenuation level can be increased and the characteristics stabilized.

Although ground pad 88A and grounding electrode terminal 10 in the present embodiment are connected by three wire leads 89A, 89B and 89C, and, ground pad 88B and grounding electrode terminal 10 are connected by three wire leads 89D, 89E and 89F, as shown in FIG. 7, it is not the intention of the present invention to be limited to this configuration. For example, ground pad 88A and grounding electrode terminal 10 may be connected using three wire leads, while ground pad 88B and grounding electrode terminal 10 may be connected using one wire lead. Instead, they may be connected with a bump for flip chip connection.

Figure 8:
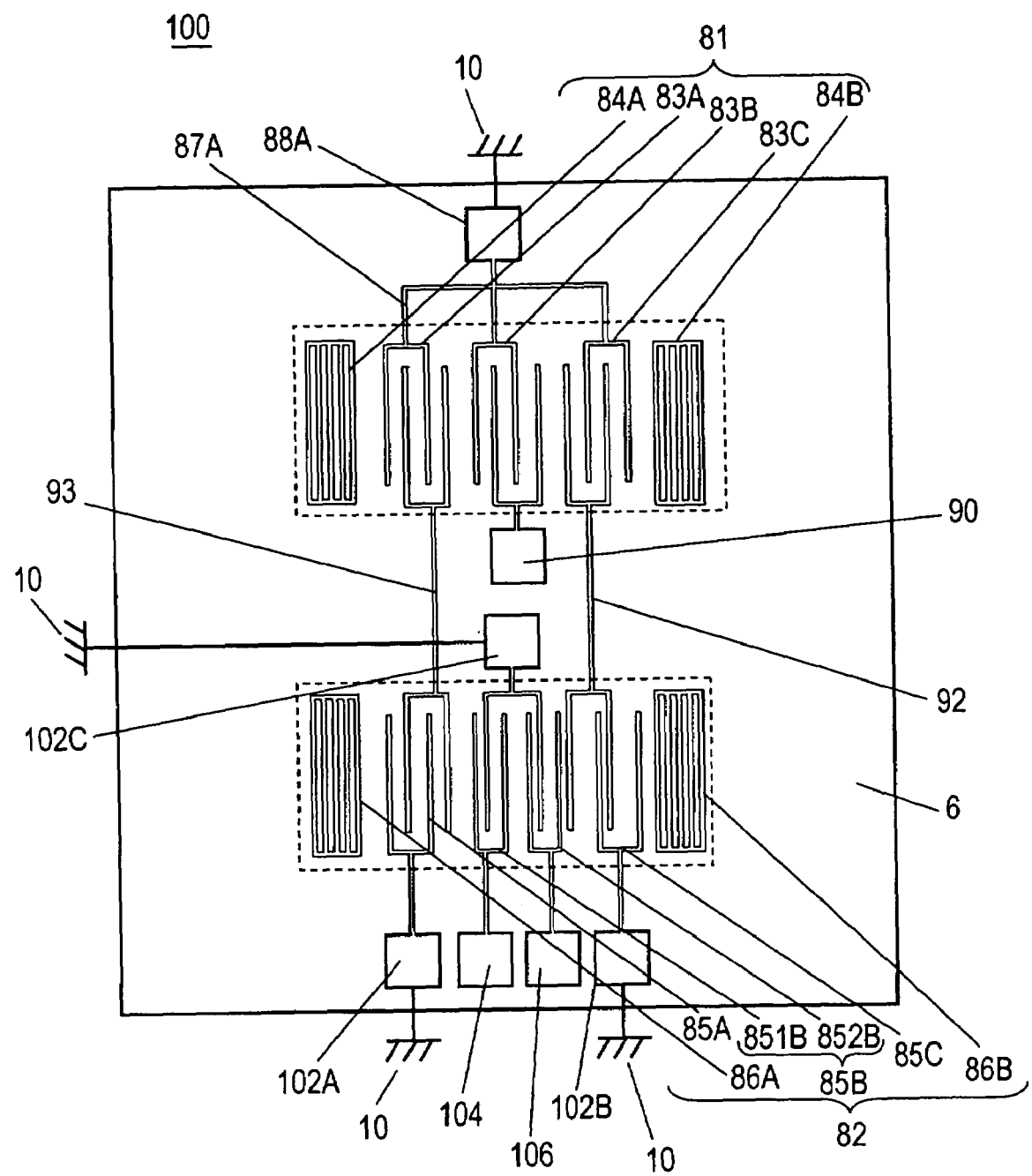
FIG. 8 shows a modification of the electrode structure in the fourth embodiment.

FIG. 8 is a plan view showing an electrode structure of SAW device 100, which is a modification of the present embodiment. First stage SAW element 81 of SAW device 100 has the same structure as that shown in FIG. 7, but second stage SAW element 82 has a different structure. Namely, the other part of the comb shaped electrode pair forming the central IDT electrode 85B in second stage SAW element 82 is common, while one part is separated into two comb shaped electrodes. Thus, IDT electrode 85B is structured of two IDT electrodes 851B and 852B. These IDT electrodes will hereafter be referred to as sub IDT electrodes 851B and 852B. The other part of the comb shaped electrode pair forming IDT electrode 85B is connected with ground pad 102C. One part of each respective comb shaped electrode pair of sub IDT electrodes 851B and 852B is connected with output pads 104 and 106, respectively.

Sub IDT electrodes 851B and 852B can be put into a balanced operation by changing their phases with respect to each other. This can lead to an increased impedance, and as a result, provides an improved matching with a circuit on which ICs and like devices, and SAW device 100 are mounted. This leads to decreased loss for SAW device 100. One part of each comb shaped electrode pair forming IDT electrodes 85A and 85C is connected with ground pads 102A and 102B, respectively.

These ground pads 102A and 102B do not necessarily need to be provided separately, but may be connected together to one ground pad.

One part of the comb shaped electrode pair forming IDT electrode 85B may be left in a floating state to be virtually grounded, instead of connecting it with input pad 102C. By doing so, the level of balance can be raised further.

Figure 9:
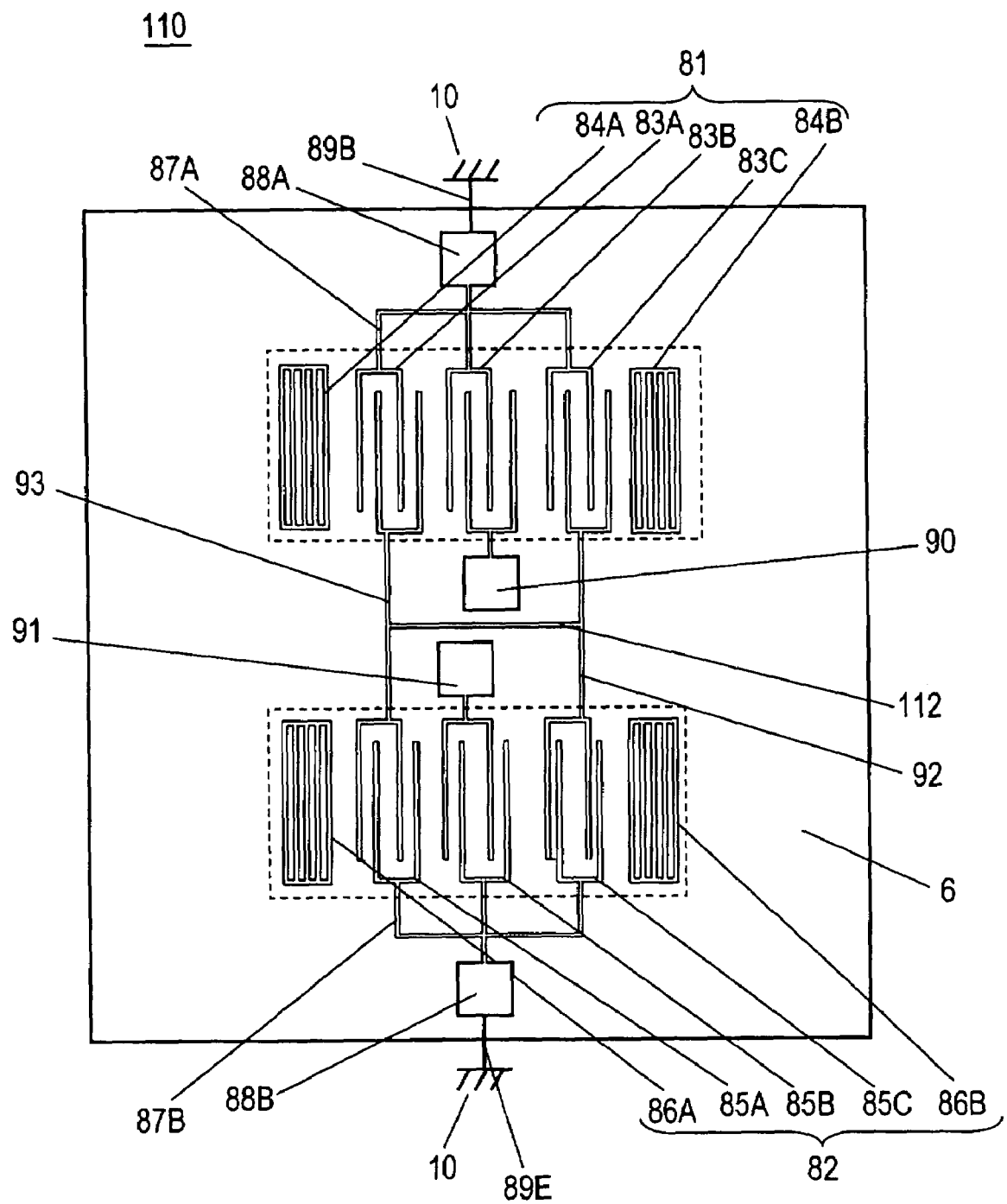
FIG. 9 shows another modification of the electrode structure in the fourth embodiment.

FIG. 9 is a plan view used to show an electrode structure of SAW device 110, which is another modification of the present embodiment. A feature of SAW device 110 is that element-to-element connection electrodes 92 and 93, as shown in FIG. 7, are also connected together by connection electrode 112, causing the signals in element-to-element electrodes 92 and 93 to have the same phase. Although ground pads 88A, 88B in the present modification are connected with grounding electrode terminal 10 by one wire lead 89B, 89E, respectively, these may be connected instead using three wire leads, in the same manner as shown in FIG. 7.

In the above configuration, the phase difference in element-to-element connection electrodes 92, 93 can be eliminated and a plurality of the real number portions can be conjugated after shifting the phase. Thus, the loss can be reduced.

In a SAW device in the present embodiment, where the SAW element is serially connected in two-stages, the loss is reduced and attenuation level is increased. Furthermore, since it requires only four connection pads, downsizing can also be attained.

Fifth Exemplary Embodiment

Figure 10:
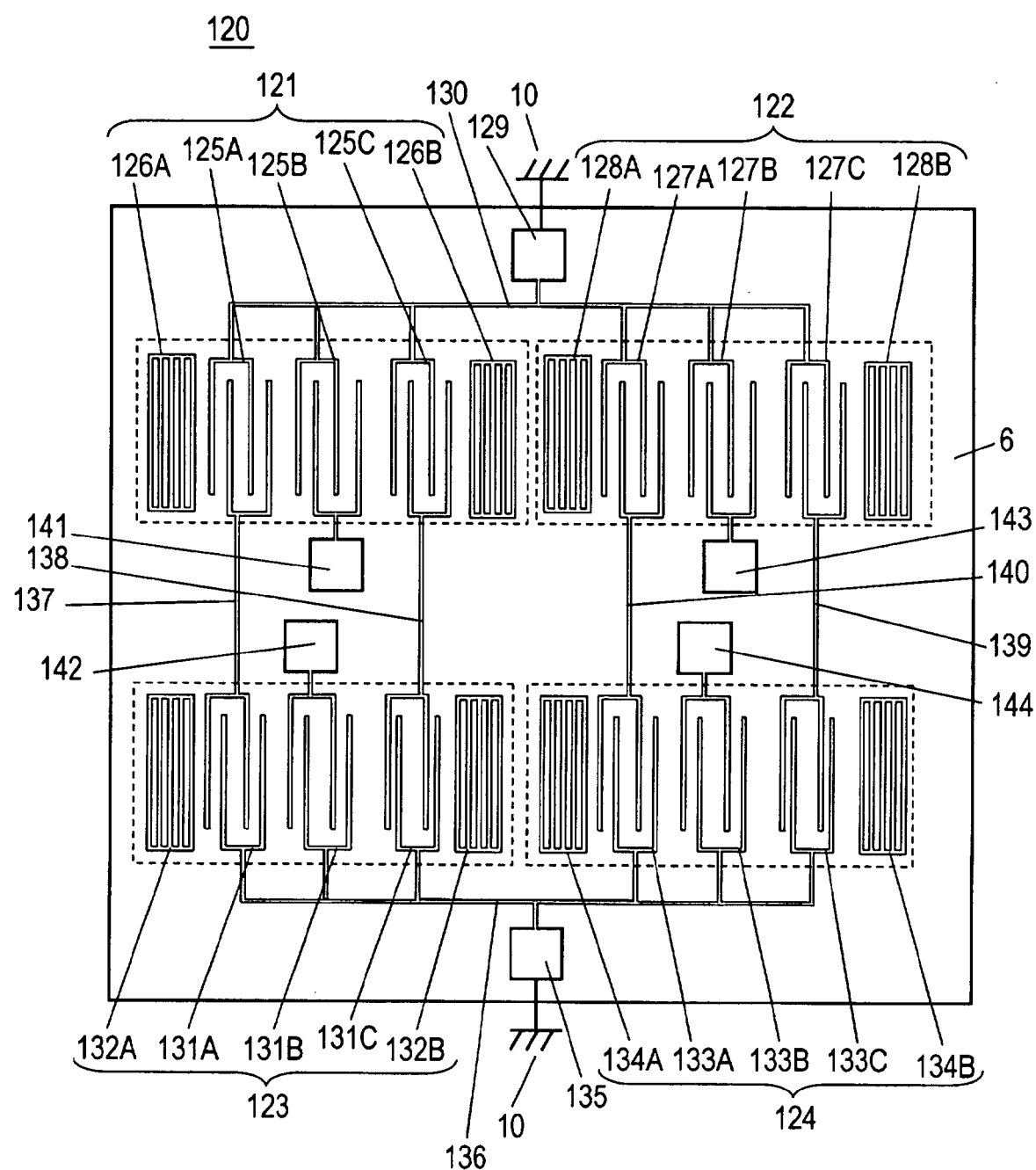
FIG. 10 is a plan view showing a structure of electrodes in a SAW device in accordance with a fifth exemplary embodiment of the present invention.

FIG. 10 is a plan view used to show an electrode structure of SAW device 120 in accordance with a fifth exemplary embodiment of the present invention. SAW device 120 in the present embodiment is formed by providing two SAW elements 121 and 122 connected in parallel, providing another two SAW elements 123 and 124 connected in parallel, and connecting these parallel-connected SAW elements in a two-stage serial connection. First stage left SAW element 121 includes three IDT electrodes 125A, 125B, 125C and reflector electrodes 126A, 126B provided at both sides of the IDT electrodes. First stage right SAW element 122 is similarly structured with three IDT electrodes 127A, 127B, 127C and reflector electrodes 128A, 128B disposed at both sides of the IDT electrodes. These elements represent the longitudinal mode coupling type, disposed along the SAW propagating direction and connected in parallel.

Second stage left SAW element 123 includes three IDT electrodes 131A, 131B, 131C and reflector electrodes 132A, 132B provided at both sides of the IDT electrodes. Right SAW element 124 is similarly structured with three IDT electrodes 133A, 133B, 133C and reflector electrodes 134A, 134B disposed at both sides of the IDT electrodes. These elements also represent the longitudinal mode coupling type, disposed along the SAW propagating direction and connected in parallel.

One part of each comb shaped electrode pair forming SAW elements 121 and 122 is connected together by ground connection electrode 130 to be led to ground pad 129. Ground pad 129 and grounding electrode terminal 10 are connected by a wire lead or other suitable connecting device.

One part of each comb shaped electrode pair forming SAW elements 123 and 124 is connected together by ground connection electrode 136 to be led to ground pad 135. Ground pad 135 and grounding electrode terminal 10 are also connected by a wire lead or other suitable connecting device.

The other part of each comb shaped electrode pair forming IDT electrodes 125A, 125C in first stage left SAW element 121 is connected with the other part of each comb shaped electrode pair forming IDT electrodes 131A and 131C in second stage left SAW element 123 by element-to-element connection electrodes 137 and 138, respectively.

In the same manner, the other part of each comb shaped electrode pair forming IDT electrodes 127A and 127C in first stage right SAW element 122 is connected with the other part of each comb shaped electrode pair forming IDT electrodes 133A and 133C in second stage right SAW element 124 by element-to-element connection electrodes 139 and 140, respectively.

The other part of the comb shaped electrode pair forming central IDT electrode 125B in first stage left SAW element 121 is connected with input pad 141. In the same manner, the other part of the comb shaped electrode pair forming central IDT electrode 127B in first stage right SAW element 122 is connected with input pad 143.

The other part of the comb shaped electrode pair forming central IDT electrode 131B in second stage left SAW element 123 is connected with output pad 142. In the same manner, the other part of the comb shaped electrode pair forming central IDT electrode 133B in second stage right SAW element 124 is connected with output pad 144.

In this way, input pads 141, 143 and output pads 142, 144 are disposed in an area opposite to ground pads 129, 135. Ground pad 129 and ground pad 135 are disposed symmetric to each other, while input pads 141, 143 and output pads 142, 144 are disposed opposed to each other. Thus, SAW device 120 is structured for a balanced operation.

With respect to other elements, SAW device 120 has been formed by the same method as described in the first to fourth embodiments.

SAW device 120 in the present embodiment is formed by connecting two longitudinal mode coupling type SAW elements 121 and 122 in parallel, connecting another two SAW elements 123 and 124 in parallel, and then connecting these parallel-connected elements together in a serial connection. This configuration provides an increasing attenuation level. Furthermore, the balanced operation makes it easier to implement the impedance matching with a circuit on which ICs and like devices, and SAW device 120 are mounted. This configuration contributes to reduce the loss.

In SAW device 120 of the present embodiment, the positioning layout between input pads 141, 143 and output pads 142, 144 may be exchanged to yield the same effects.

One part of each comb shaped electrode pair forming IDT electrodes 125A, 125B, 125C, 127A, 127B, 127C is connected together by ground connection electrode 130, which is connected with ground pad 129. One part of each comb shaped electrode pair forming IDT electrodes 131A, 131B, 131C, 133A, 133B, 133C is connected together by ground connection electrode 136, which is connected with ground pad 135. This means that these electrodes are connected in common with ground pads 129 and 135, and as a result, the ground level can be made to be low with the same value. Therefore, the grounding can be reinforced and attenuation level can be increased, among other filter characteristics.

Although the present embodiment has been described based on a balanced type, at least one of the input pad and the output pad can be an unbalanced type.

If the SAW device is structured to perform a balanced operation by, for example, disposing input pads 141, 143, output pads 142, 144 and ground pads 129, 135 to be symmetrical to each other, then the impedance matching with a circuit, on which ICs or like devices, and SAW device 120 are mounted, is easier, and the loss can be reduced.

Furthermore, if ground pads 129, 135 and grounding electrode terminal 10 are connected by a plurality of wire leads or by a bump, then the ground level can be lowered and stabilized a step further. As a result, the attenuation level can be increased.

If the electrode structure is designed so that impedance at respective SAW elements 121, 122, 123 and 124 is 100Ω, then impedance of SAW device 120 as a whole is 50Ω since SAW elements 121 and 122, as well as SAW elements 123 and 124, are connected together in a parallel arrangement.

Namely, in a case where there are n pieces of parallel-connected SAW elements (n: an integer 2 or any number higher than 2), impedance of respective SAW elements as seen from input pad or output pad is (50×n )Ω. Since these are connected in parallel, impedance of a SAW device as a whole is 50Ω. Thus, the connecting compatibility with external components or devices is increased.

Still further, reference is made to FIG. 10, where the cross talk can be suppressed and the attenuation level can be increased by making the phase of adjacent element-to-element connection electrodes different from each other. For example, referring to FIG. 10, the phase of element-to-element connection electrodes 137, 138 can be made positive, while the phase of other element-to-element connection electrodes 139, 140 can be made negative.

Figure 11:
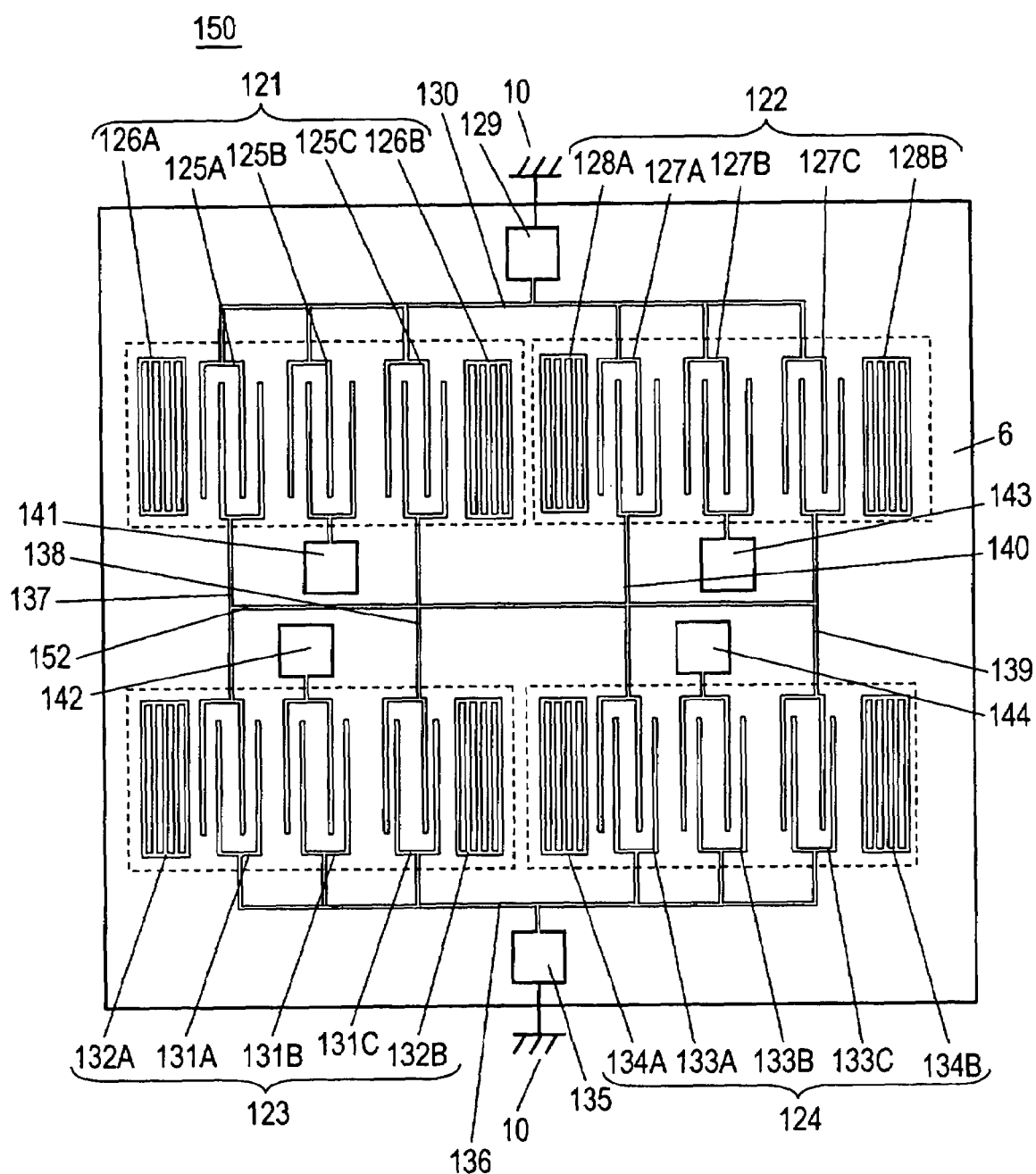
FIG. 11 shows a modification of the electrode structure in the fifth embodiment.

FIG. 11 is a plan view used to show an electrode structure of SAW device 150, which is a modification of the present embodiment. The point of difference from SAW device 120 of FIG. 10 is that element-to-element connection electrodes 137, 138, 139 and 140 are connected in common by connection electrode 152, so that the signals in the element-to-element connection electrodes 137, 138, 139 and 140 have the same phase.

Since the phase difference among element-to-element connection electrodes 137, 138, 139 and 140 can be eliminated and the symmetry improved in the above configuration, the loss can be reduced and the attenuation level can be increased further.

Although the present embodiment has been described based on an example in which two SAW elements are connected in parallel, the number of parallel-connected SAW elements may be 2 or any number higher than 2. The greater the number of parallel-connected SAW elements, the more the loss can be reduced. Further, the two-stage serial connection implements a higher attenuation level.

In the present configuration, the number of connection pads is six, or a slight increase of two from that shown in FIG. 2, 6, 7 or 9. The SAW device in the present embodiment, however, exhibits a superior characteristic in attenuation level.

Figure 12:
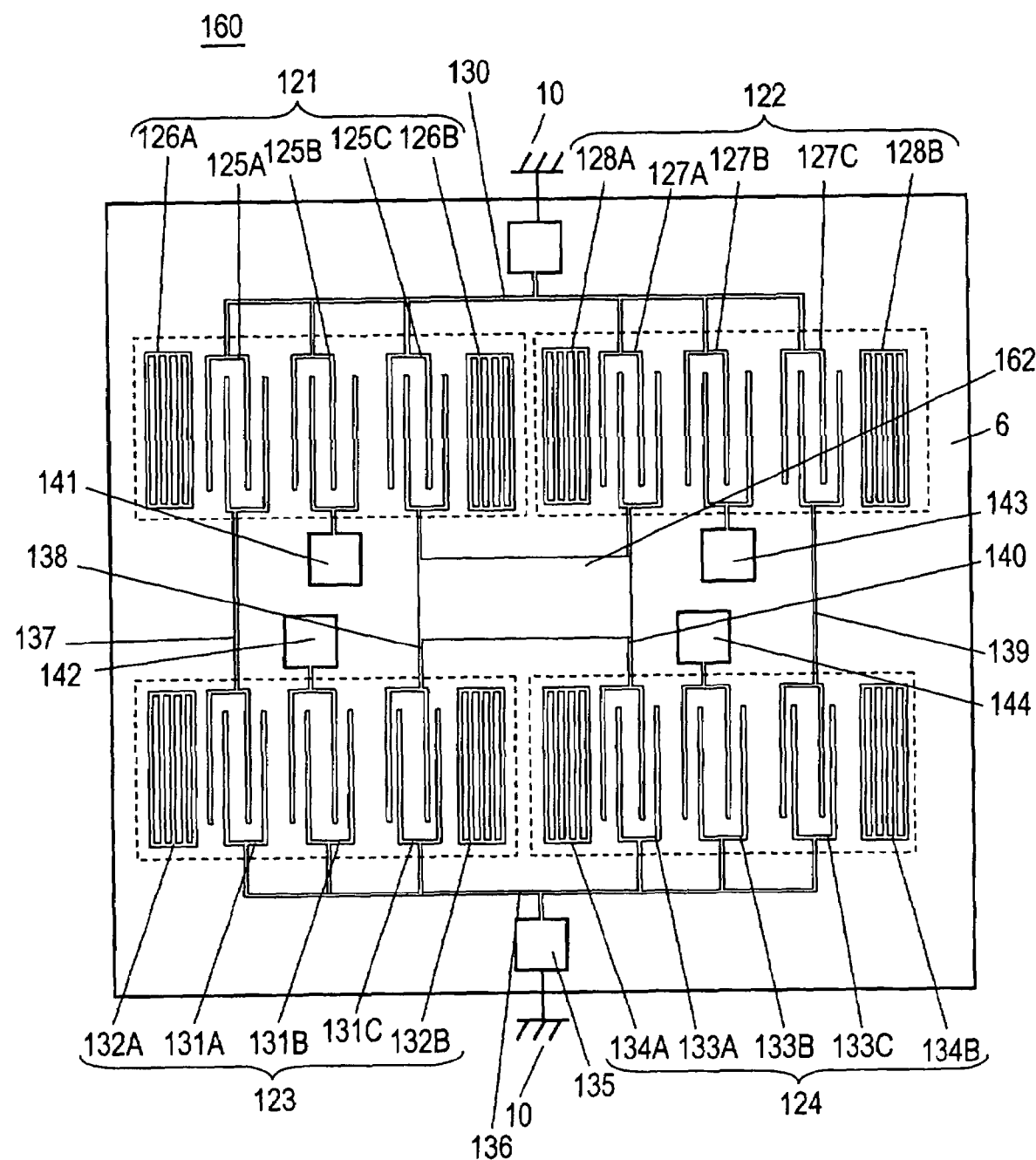
FIG. 12 shows another modification of the electrode structure in the fifth embodiment.

FIG. 12 is a plan view used to show an electrode structure of SAW device 160, which is a still another modification of the present embodiment. In SAW device 160, element-to-element connection electrodes 137 and 139 have the same phase, and element-to-element connection electrodes 138 and 140 opposing each other are also made to have the same phase. Whereas, the phase between element-to-element connection electrodes 137, 139 and element-to-element connection electrodes 138, 140 is reversed. Because of this, element-to-element connection electrodes 138 and 140 opposing each other are connected together by broad-width connection electrode 162.

Because of broad-width connection electrode 162 connecting element-to-element connection electrodes 138 and 140, the respective impedance between IDT electrode 125C of first stage left SAW element 121 and IDT electrode 131C of second stage left SAW element 123, and between IDT electrode 127A of first stage right SAW element 122 and IDT electrode 133A of second stage right SAW element 124, can be reduced. As a result, the loss can be reduced further.

In the present embodiment, in which two SAW elements are connected in parallel and the parallel-connected SAW elements are serially connected in two-stages, the increase in connection pad counts is suppressed. Thereby, a SAW device that is small in size, having a reduced loss, and provided with a high attenuation level is provided.

Sixth Exemplary Embodiment

Figure 13:
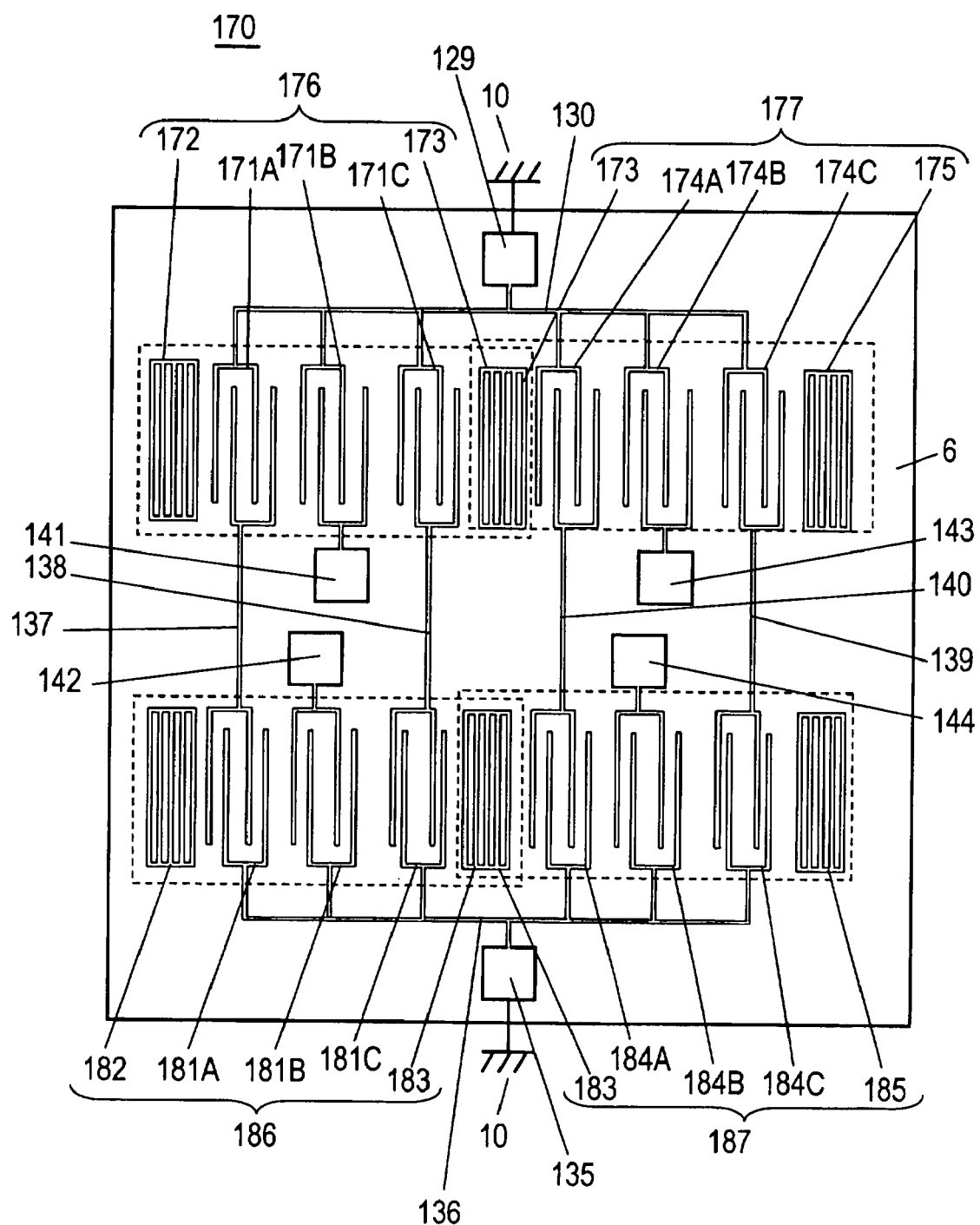
FIG. 13 is a plan view showing a structure of electrodes in a SAW device in accordance with a sixth exemplary embodiment of the present invention.

FIG. 13 is a plan view used to show an electrode structure of SAW device 170 in a sixth exemplary embodiment of the present invention. SAW device 170 is a modification of SAW device 120 in the fifth embodiment.

SAW device 170 is slightly different from SAW device 120 in the structure of SAW elements 176, 177, 186, 187. Namely, first stage left SAW element 176 is formed of three IDT electrodes 171A, 171B, 171C and reflector electrodes 172, 173 disposed at both sides of the IDT electrodes. First stage right SAW elements 177 is formed of three IDT electrodes 174A, 174B, 174C and reflector electrodes 173, 175 disposed at both sides of the IDT electrodes. Second stage left SAW element 186 is formed of three IDT electrodes 181A, 181B, 181C and reflector electrodes 182, 183 disposed at both sides of the IDT electrodes. Second stage right SAW elements 187 is formed of three IDT electrodes 184A, 184B, 184C and reflector electrodes 183, 185 disposed at both sides of the IDT electrodes.

As described above, the reflector electrode located at the right side of first stage left SAW element 176 and the reflector electrode located at the left side of first stage right SAW element 177 are the same single reflector electrode 173. That is, reflector electrode 173 is shared by the two SAW elements. The reflector electrode locating at the right side of second stage left SAW element 186 and the reflector electrode locating at the left side of second stage right SAW element 187 are the same single reflector electrode 183. That is, reflector electrode 173 is shared by the two SAW elements.

In the above-described structure, the first stage parallel-connected SAW elements 176, 177 and the second stage parallel-connected SAW elements 186, 187 eliminate one reflector electrode each. Therefore, SAW device 170 can be made smaller in size.

In the present structure, the greater the number of SAW elements in a device, the more significant the advantage of eliminating the reflector electrode becomes. By eliminating a reflector electrode, there will be more space available for further downsizing of a SAW device.

SAW device 170 in the present embodiment has been provided by connecting longitudinal mode coupling type SAW elements 176 and 177 in parallel, connecting SAW elements 186 and 187 in parallel, and then connecting these parallel-connected elements serially in two stages. Therefore, the device exhibits a reduced loss and superior filter characteristics.

Furthermore, the balanced operation makes it easier to implement the impedance matching with a circuit on which ICs or like devices, and SAW device 170 are mounted, and the loss is reduced further.

Also in the present embodiment, a switched positioning layout between the input pad and the output pad generates the same effects.

Furthermore, since IDT electrodes 171A, 171B, 171C, 174A, 174B, 174C are connected together in common by ground connection electrode 130 and led to ground pad 129, and IDT electrodes 181A, 181B, 181C, 184A, 184B, 184C are connected altogether by ground connection electrode 136 and led to ground pad 135, the grounding is common and the ground level can be lowered and stabilized. Consequently, the attenuation level can be increased.

Furthermore, since the balanced operation can be implemented by disposing ground pads 129 and 135 to be symmetrical to each other, the impedance matching with a circuit, on which ICs and the devices, and SAW device 170 are mounted, becomes easier, and the loss can be decreased.

Although the present embodiment has been described based on a balanced type, at least one of input pad and output pad may be an unbalanced type.

Although the present embodiment has been described based on an example in which two SAW elements are connected in parallel and the parallel-connected SAW elements are serially connected in two-stages, it is not the intention of the present invention to be limited to this configuration. For example, the number of parallel-connected SAW elements may be 2 or any number higher than 2. The greater the number of parallel-connected SAW elements, the more the loss can be reduced.

Furthermore, the connecting compatibility with external components or devices can be raised by disposing input pads 141 and 143, output pads 142 and 144, and ground pads 129 and 135 symmetrical to each other.

Furthermore, the ground level can be lowered and stabilized a step further by connecting ground pads 129, 135 and grounding electrode terminals 10 using a plurality of wire leads or by a bump. Thereby, the loss can be reduced.

Still further, the impedance as seen from input pads 141, 143, or output pads 142, 144, is 50Ω, by designing the electrode structure so that the respective SAW elements 176, 177, 186 and 187 exhibit an impedance of 100Ω.

Namely, in a case where there are n pieces of parallel-connected SAW elements (n: 2 or an integer higher than 2), the impedance of SAW device as a whole can easily be made to be 50Ω by designing the electrode structure so that impedance of respective SAW elements as seen from input pad, or output pad, exhibits (50×n )Ω. Thus, the connecting compatibility with external components or devices can be raised.

Furthermore, as a modification of the present embodiment, element-to-element connection electrodes 137, 138, 139, 140 may be connected together by a connection electrode for making the signals therein to have the same phase. Alternatively, the adjacent element-to-element connection electrodes can be made to be reverse-phased to each other if element-to-element connection electrodes 137 and 140 have the same phase. Element-to-element connection electrodes 138 and 139 have the same phase, while element-to-element connection electrodes 137 and 140 are reverse-phased. By doing this, the cross talk is reduced, and the attenuation level can be increased.

Alternatively, there can be another structure in which element-to-element connection electrodes 137 and 139 have the same phase, and element-to-element connection electrodes 138 and 140 have the same phase, whereas the phase between element-to-element connection electrodes 137, 139 and element-to-element connection electrodes 138, 140 is reversed.

Still further, since impedance between IDT electrodes 171C and 181C, and between IDT electrodes 174A and 184A, can be reduced by connecting element-to-element connection electrode 138 and element-to-element connection electrode 140 with a broad-width connection electrode, the loss can be reduced a step further.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

What is claimed is:

1. A surface acoustic wave device comprising:
   a plurality of surface acoustic wave elements connected in parallel, wherein each of said surface acoustic wave elements comprises:
   at least three interdigital transducer electrodes,
   wherein said interdigital transducer electrodes are operable to generate a surface acoustic wave that travels in a propagating direction, and wherein each of said interdigital transducer electrodes is formed of a comb shaped electrode pair;
   a first reflector electrode disposed at a first side of said interdigital transducer electrodes; and
   a second reflector electrode disposed at a second side of said interdigital transducer electrodes,
   wherein said first and second reflector electrodes are disposed in the propagating direction of the surface acoustic wave generated by said interdigital transducer electrodes;
   one ground connection electrode that connects together a first part of each comb shaped electrode pair forming said interdigital transducer electrodes; and
   one ground pad that is connected to said ground connection electrode.

2. The surface acoustic wave device according to claim 1, further comprising at least one input pad and at least one output pad,
   wherein a second part of each comb shaped electrode pair is connected with said at least one input pad or said at least one output pad.

3. The surface acoustic wave device one of claim 2, wherein
   said interdigital transducer electrodes are structured so that said at least one input pad and said at least one output pad operate in a balanced state.

4. The surface acoustic wave device of claim 2, wherein at least two of said interdigital transducer electrodes are connected together in common with said at least one input pad or said at least one output pad.

5. The surface acoustic wave device of claim 2, wherein said interdigital transducer electrodes are structured so that impedance as viewed from said input pad or said output pad, is approximately 50Ω.

6. The surface acoustic wave device of claim 1, wherein said plurality of surface acoustic wave elements share in common one of said first reflector electrode and said second reflector electrode.

7. The surface acoustic wave device of claim 1,
wherein at least one of said first and second reflector electrodes is formed of a plurality of strip electrodes and a bus bar electrode, and
wherein different gaps are provided between different adjacent pairs of said strip line electrodes.

8. The surface acoustic wave device of claim 7, wherein said bus bar electrode comprises a first region and a second region, and
said gap between respective strip line electrodes is different in said first and said second region.

9. The surface acoustic wave device of claim 7, wherein said gap between respective strip line electrodes is different throughout an entire width of said bus bar electrode.

10. The surface acoustic wave device of claim 1, wherein at least one of said first and second reflector electrodes is formed of a plurality of strip line electrodes and a bus bar electrode,
said bus bar electrode comprises a plurality of regions,
substantially identical gaps are formed between each adjacent pair of strip line electrodes, and
lengths of the respective strip line electrodes are different in said plurality of regions.

11. The surface acoustic wave device of claim 1, wherein in a case where there are n pieces, or more, of said surface acoustic wave elements, wherein n=an integer of 2 or more, said interdigital transducer electrodes are structured so that each of said surface acoustic wave elements has an impedance of $(50 \times n)\Omega$.

12. The surface acoustic wave device of claim 1, wherein said surface acoustic wave elements are formed on a piezoelectric substrate.

13. A surface acoustic wave device comprising:
a first surface acoustic wave element and a second surface acoustic wave element, wherein each of said first and second surface acoustic wave elements comprises:
at least three interdigital transducer electrodes,
wherein each of said interdigital transducer electrodes is formed of a comb shaped electrode pair, and wherein said interdigital transducer electrodes are operable to generate
a surface acoustic wave that travels in a propagation direction;
a first reflector electrode disposed at a first side of said interdigital transducer electrodes; and
a second reflector electrode disposed at a second side of said interdigital transducer electrodes,
wherein said first and second reflector electrodes are disposed in the propagating direction of the surface acoustic wave generated by said interdigital transducer electrodes;
at least one ground connection electrode, wherein, in at least one of said first and second surface acoustic wave elements, a first part of each comb shaped electrode pair forming said interdigital transducer electrodes is connected together in common by said at least one ground connection electrode;
one ground pad that connects to said at least one ground connection electrode;
a first element-to-element connection electrode, wherein a second part of a first comb shaped electrode pair in each of said first and said second surface acoustic wave elements is connected together by said first element-to-element connection electrode;
a second element-to-element connection electrode, wherein a second part of a second comb shaped electrode pair in each of said first and said second surface acoustic wave elements is connected together by said second element-to-element connection electrode; and
a third surface acoustic wave element and a fourth surface acoustic wave element,
wherein said first and second element-to-element electrodes serially connect said first and said second surface acoustic wave elements in two-stages,
wherein each of said third and said fourth surface acoustic wave elements comprises a second plurality of interdigital transducer electrodes,
wherein each of said second plurality of interdigital electrodes is formed of a comb shaped electrode pair,
wherein said first and said third surface acoustic wave elements are disposed in said propagating direction of said surface acoustic wave, and are connected in parallel, and
wherein said second and said fourth surface acoustic wave elements are disposed in the propagating direction of the surface acoustic wave, and are connected in parallel.

14. The surface acoustic wave device according to claim 13, further comprising at least one input pad and at least one output pad,
wherein a second part of at least one comb shaped electrode pair is connected with said at least one input pad or said at least one output pad.

15. The surface acoustic wave device of claim 14,
wherein, in at least one of said third and fourth surface acoustic wave elements, a first part of each comb shaped electrode pair forming said interdigital transducer electrodes is connected together in common by said ground connection electrode, and further comprising:
a third element-to-element connection electrode, wherein a second part of a first comb shaped electrode pair in each of said third and said fourth surface acoustic wave elements is connected together by said third element-to-element connection electrode;
a fourth element-to-element connection electrode, wherein a second part of a second comb shaped electrode pair in each of said third and said fourth surface acoustic wave elements is connected together by said fourth element-to-element connection electrode; and
wherein said third and fourth element-to-element electrodes serially connect said third and said fourth surface acoustic wave elements in two-stages.

16. The surface acoustic wave device of claim 14, wherein said interdigital transducer electrodes are structured so that said at least one input pad and said at least one output pad operate in a balanced state.

17. The surface acoustic wave device of claim 14, wherein at least two of said interdigital transducer electrodes are connected together in common with said at least one input pad or said at least one output pad.

18. The surface acoustic wave device of claim 15, wherein said first and said third surface acoustic wave elements share in common one of said first reflector electrode and said second reflector electrodes.

19. The surface acoustic wave device of claim 15, wherein said interdigital transducer electrodes are structured so that said at least one input pad and said at least one output pad operate in a balanced state.

20. The surface acoustic wave device of claim 15, wherein at least two of said interdigital transducer electrodes are connected together in common with said at least one input pad or said at least one output pad.

21. The surface acoustic wave device of claim 15, wherein one of said first and said second element-to-element connection electrodes, and one of said third and said fourth element-to-element connection electrodes, oppose each other, and
signals in said element-to-element connection electrodes that oppose each other have the same phase.

22. The surface acoustic wave device of claim 15, further comprising:
a connection electrode which connects one of said first and said second element-to-element connection electrodes with one of said third and said fourth element-to-element connection electrodes.

23. The surface acoustic wave device of claim 15, further comprising:
a connection electrode which connects together in common said first, second, third and fourth element-to-element connection electrodes.

24. The surface acoustic wave device of claim 13,
wherein at least one of said first and second reflector electrodes is formed of a plurality of strip line electrodes and a bus bar electrode, and
wherein different gaps are provided between different adjacent pairs of said strip line electrodes.

25. The surface acoustic wave device of claim 24, wherein said bus bar electrode comprises a first region and a second region, and
said gap between respective strip line electrodes is different in said first and said second region.

26. The surface acoustic wave device of claim 24, wherein said gap between respective strip line electrodes is different throughout an entire width of said bus bar electrode.

27. The surface acoustic wave device of claim 13,
wherein at least one of said first and second reflector electrodes is formed of a plurality of strip line electrodes and a bus bar electrode, and
wherein different gaps are provided between different adjacent pairs of said strip line electrodes.

28. The surface acoustic wave device of claim 27, wherein said bus bar electrode comprises a first region and a second region, and
said gap between respective strip line electrodes is different in said first and said second region.

29. The surface acoustic wave device of claim 27, wherein said gap between respective strip line electrodes is different throughout an entire width of said bus bar electrode.

30. The surface acoustic wave device of claim 13, wherein
at least one of said first and second reflector electrodes is formed of a plurality of strip line electrodes and a bus bar electrode,
said bus bar electrode comprises a plurality of regions,
substantially identical gaps are formed between each adjacent pair of strip line electrodes, and
lengths of the respective strip line electrodes are different in said plurality of regions.

31. The surface acoustic wave device of claim 13, wherein
at least one of said first and second reflector electrodes is formed of a plurality of strip line electrodes and a bus bar electrode,
said bus bar electrode comprises a plurality of regions,
substantially identical gaps are formed between each adjacent pair of strip line electrodes, and
lengths of the respective strip line electrodes are different said plurality of regions.

32. The surface acoustic wave device of claim 13, wherein
in a case where there are n pieces, or more, of said surface acoustic wave elements, wherein n=an integer of 2 or more, said interdigital transducer electrodes are structured so that each of said surface acoustic wave elements has an impedance of $(50 \times n)\Omega$.

33. The surface acoustic wave device of claim 13, wherein signals in said element-to-element connection electrodes are reverse-phased to each other.

34. The surface acoustic wave device of claim 13, further comprising an electrode for connecting said first element-to-element connection electrode with said second element-to-element connection electrode.

35. The surface acoustic wave device of claim 13, wherein said ground connection electrode which connects together in common said first part of the comb shaped electrode pair forming each of said interdigital transducer electrodes, and said ground pad, are disposed to be symmetrical to each other.

36. The surface acoustic wave device of claim 13, wherein said ground connection electrode which connects together in common said one part of the comb shaped electrode pair forming each of said interdigital transducer electrodes, and said ground pad, are disposed to be symmetrical to each other.

37. The surface acoustic wave device of claim 13, wherein said surface acoustic wave elements are formed on a piezoelectric substrate.

* * * * *